June 3, 1969 W. J. BILO ET AL 3,447,975

BILAYER PROTECTIVE COATING FOR EXPOSED P-N JUNCTION SURFACES

Filed Sept. 13, 1965

WITNESSES:
Bernard R. Gieguer
Donald M. Winegar

INVENTORS
William J. Bilo and
John F. Steinbach.

BY
C. L. Menzemer
ATTORNEY

United States Patent Office 3,447,975
Patented June 3, 1969

3,447,975
BILAYER PROTECTIVE COATING FOR EXPOSED P-N JUNCTION SURFACES

William J. Bilo, Irwin, and John F. Steinbach, Lewistown, Pa., assignors to Westinghouse Electric Corporation, Pittsburgh, Pa., a corporation of Pennsylvania Filed Sept. 13, 1965, Ser. No. 486,613
Int. Cl. H01l 7/34
U.S. Cl. 148—33.3 11 Claims

ABSTRACT OF THE DISCLOSURE

The exposed surfaces of p-n junctions contained in a body of semiconductor material are protected by a first protective coating disposed on the exposed portions of the p-n junction and consisting of a reaction product of a halogenated organic silane, hydroxyl ions present in lattice sites on the surface of a body of semiconductor material, and semiconductor material comprising the body. A second protective coating consisting of essentially a water impervious material of a protective coating material selected from a group consisting of vulcanizing rubbers and perfluorohydrocarbons disposed on the first protective coating.

The present invention relates to a protective treatment for semiconductor devices and particularly to protecting p-n junctions within a body of semiconductor material from the reactive components of the atmosphere.

In the operation of semiconductor devices degradation of performance frequently occurs due to surface phenomena such as the presence of leakage paths on or near the surface of the body of semiconductor material contained within the device.

In order to prevent the deleterious effects of moisture and the reactive constituents of the atmosphere, semiconductor devices have been provided with a protective coating of suitable material. Suitable materials employed in prior art devices have included electrically insulating varnishes, shellacs, and resins. These materials when properly applied to the semiconductor devices stabilize the electrical characteristics of the exposed surfaces of the devices within a tolearble range of values. By stabilizing these electrical characteristics, one is able to minimize the current leakage in a reverse direction across that portion of the surface in which a p-n junction is terminated.

The formation of an organic-silicon layer on the exposed surfaces of a p-n junction slows the reaction between the junction surface and the reactive contaminents of the atmosphere but does not stop the reaction from continuing to occur.

The employment of a layer of electrically insulating varnish disposed on an organic-silicon layer further reduces the action between the junction surface and the reactive contaminents of the atmosphere. However, mechanical stressing of the varnish layer resulting from thermal expansion and contraction of the semiconductor devices results in cracking within the varnish layer and separation of the varnish layer from the surface of the semiconductor devices. These defects therefore allow the moisture and reactive constituents of the atmosphere to have a means to continue their attack on the semiconductor devices.

The usual manner of applying a protective coating is to employ a hypodermic syringe, a fine brush, a wire loop and similar tools to apply the protective material on the semiconductor devices. Often, however, either the coating did not cover essential areas of the device properly or the coatings utilized more material than was necessary.

An object of this invention is to provide a protective coating disposed on at least the exposed surfaces of p-n junctions contained in semiconductor devices, the protective coating consisting of a first layer of a reaction product of a halogenated organic silane, hydroxyl ions disposed in lattice sites on the surface of a body of semiconductor material and semiconductor material comprising the body disposed on the exposed surfaces of the p-n junctions and a second layer consisting of at least one material selected from the group consisting of vulcanizing rubbers and perfluorohydrocarbons.

Another object of this invention is to provide a process for disposing a protective coating on at least the exposed surfaces of p-n junctions contained in semiconductor devices, the process comprising, disposing a first layer of a reaction product of a halogenated organic silane, hydroxyl ions disposed in lattice sites on the surface of a body of semiconductor material, and semiconductor material comprising the body, on the exposed surfaces of the p-n junctions and disposing a second layer upon the first layer, said second layer consisting of at least one material selected from the group consisting of vulcanizing rubbers and perfluorohydrocarbons.

A further object of this invention is to provide a process for disposing a protective coating on at least the exposed surfaces of a p-n junction contained in semiconductor devices, the process comprising exposing at least the exposed surfaces of the p-n junctions contained in semiconductor devices to water vapor whereby the p-n junctions are deliberately down graded by the formation of hydroxyl ions in all available sites within the exposed surfaces of the p-n junctions, disposing a first layer consisting of a reaction product of a halogenated organic silane and the hydroxyl ions in the sites and a semiconductor material on the exposed surfaces of the down graded p-n junctions and disposing, upon the first layer, a second layer consisting of at least one material selected from the group consisting of vulcanizing rubbers and perfluorohydrocarbons.

Other objects of this invention will in part, be obvious and will, in part, appear hereinafter.

For a better understanding of the nature and objects of this invention, reference should be had to the following detailed description and drawings, in which.

In accordance with the present invention and attainment of the foregoing objects, there is provided a semiconductor device comprising a body of semiconductor material. The body of semiconductor material has at least one p-n junction contained therein which is exposed at least in one surface of the body. A protective coating is disposed on at least that portion of the surface of the body containing the exposed p-n junction. The protective coating consists of a first layer of a reaction product of a halogenated organic silane, hydroxyl ions and the semiconductor material disposed on the portion of the body's surface. A second layer of a protective coating material selected from the group consisting of room temperature vulcanizing rubbers and perfluorohydrocarbons is disposed on the first layer.

To more particularly explain the invention, reference will be made to a protective coating applied to a body of silicon semiconductor material. However, it is to be understood that other semiconductor materials such, for example, as germanium, silicon carbide, compounds of group III and group IV elements and components of group II and group IV elements may be treated, in accordance with the teachings of this invention.

Figure 1:
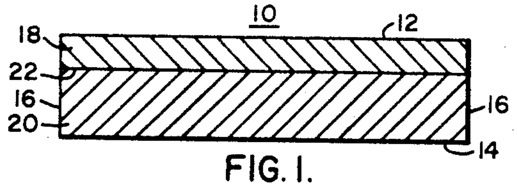
FIG. 1 is a cross-sectional view of a body of semiconductor material.

With reference to FIG. 1, there is shown a body 10 of silicon. The body 10 has a top surface 12, a bottom surface 14 and a side surface 16. The body 10 has a first layer 18 of first type semiconductivity, a second layer 20 of second type semiconductivity and a p-n junction 22 at the interface of the layers 18 and 20.

Figure 2:
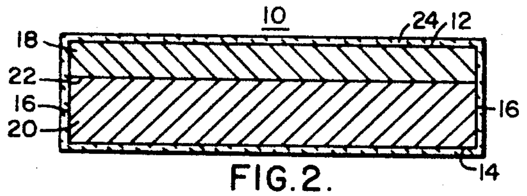
FIG. 2 is the body of FIG. 1 in cross-section treated in accordance with the teachings of this invention to form a first layer of a first type of water impervious material on its surfaces.

With reference to FIG. 2, there is shown the body 10 after a layer 24 of a reaction product of a halogenated organic silane, hydroxyl ions and silicon comprising the body 10 has been formed on all exposed surfaces of the body 10. The body 10 upon exposure to an ambient containing water vapor will inherently have hydroxyl ions, or hydroxyl groups, disposed in lattice sites on the surfaces 12, 14 and 16.

To form the layer 24, the body 10 is heated in a solution of a halogenated organic silane and a suitable solvent. The solvent is one which is nonreactive with the halogenated organic silane. Upon heating the body 10 in the solution, a reaction occurs between the halogenated organic silane, the hydroxyl groups in the lattice sites and the silicon comprising the body 10. A halogen atom of the halogenated organic silane combines with a hydrogen atom of the hydroxyl group and passes off as a gas. The oxygen atom of the hydroxyl group then combines with the silicon atom of the remaining portion of the halogenated organic silane. Since the oxygen atom of the hydroxyl group was already combined with an atom of silicon comprising the body 10, the resulting chemical action may be shown as an example:

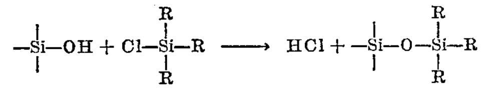

The resulting layer 24 is a series of water impervious organic groups on the surfaces 12, 14 and 16 of the body 10. The layer 24 is only one molecule in thickness and is incapable of forming hydrogen bonds with water.

A preferred halogenated organic silane suitable for the formation of the layer 24 is diphenyldichlorosilane.

A preferred means of employing the diphenyldichlorosilane is to dilute it in a high boiling solvent. The solvent must be one which is nonreactant with the diphenyldichlorosilane. Preferably, the solvent should also be one which has a boiling point of approximately 100° C. or higher. Suitable non-reactive solvents are p-cymene, n-decane and xylene, the xylene being preferred.

A solution of from ½% to 3%, by volume, 1% being preferred, of diphenyldichlorosilane in xylene may be used in forming the layer 24. The solution is maintained at an elevated temperature of from 90° C. to 130° C. with the preferred temperature being 110° C.±10° C.

The body 10 is heated in this solution for a sufficient time for a complete chemical reaction between the diphenyldichlorosilane, the hydroxyl groups inherently present in lattice sites on the surfaces 12, 14 and 16 and silicon comprising the body 10 to take place.

Although the complete layer 24 can and usually is formed within 15 minutes' heating time, the body may be heated in the solution for as long as one hour to ensure a complete reaction.

After the body 10 has been heated in the solution for a sufficient length of time, the body 10 is removed and washed with acetone.

The body 10 is then placed in a vacuum chamber. The chamber is heated to drive off any residual moisture and other contaminents from the body 10. The exhaust from the vacuum chamber passes through a cold trap which removes the excess moisture and any contaminents on the body 10.

Figure 3:
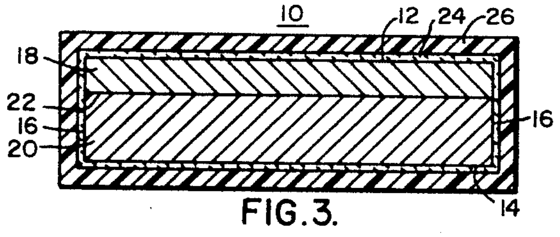
FIG. 3 is the body of FIG. 2 in cross-section with a layer of second type water impervious material disposed on the first layer in accordance with the teachings of this invention.

FIG. 3 is a view of the body 10 after a coating 26 of a protective material has been disposed on the monolayer 24. The coating 26 is applied by any of the acceptable means known to those skilled in the art such, for example, as painting, spraying, dipping and the like.

The material comprising the coating 26 should be essentially water impervious. The material should contain as few active groups, such, for example, as oxygen or nitrogen groups, as possible in order to prevent hydrogen from bonding with water both on the surface, and within the structure, of the coating 26. The lack of active groups therefore restricts the diffusion of water through the coating 26. The material should also be flexible enough to endure thermal cycling of the body 10 without fracturing the layer 26 or separating from the layer 24.

Rubbers and perfluorohydrocarbons are examples of suitable materials for the coating 26. Preferably, coating 26 is a room temperature vulcanizing rubber.

A suitable room temperature vulcanizing rubber is a silicone rubber consisting of a copolymer of dimethyl polysiloxane and methyl hydrogen polysiloxane. A catalyst, lead octoate, is mixed with the copolymer of dimethyl polysiloxane and methyl hydrogen polysiloxane in order to produce a room temperature vulcanizing silicone rubber which will cure in approximately 24 hours.

A modification of the above process and to assure complete and stable passivation of the surfaces 12, 14 and 16 of the body 10 during the halogenated organic silane treatment, a separate step for degrading the body 10 may be practiced.

At temperatures above approximately 190° C., active surface sites on the surfaces 12, 14 and 16 chemically react with water vapor to form hydroxyl groups, the reaction being irreversible. These hydroxyl groups formed are, by nature, ionic, that is to say, a partially ionic bond exists between the oxygen and hydrogen atoms, and these hydroxyl groups cause high junction leakage on the body 10. However, the ionic bonds can be converted to covalent bonds by treatment with silanes.

Therefore, when all the active surface sites on the surfaces 12, 14 and 16 of the body 10 are converted to hydroxyl groups by the chemical reaction with moist air above approximately 190° C. and then stabilized by forming the monolayer 24 of a reaction product of a halogenated organic silane and hydroxyl ions disposed in lattice sites on the surfaces 12, 14 and 16 and silicon on the surfaces 12, 14, 16, future degradation of the body 10 by water vapor is eliminated.

Protective coating material is then disposed upon the monolayer 24, to form a similar coating such, for example, as the coating 26 shown in FIG. 3. The materials are the same as those described for the coating 26.

EXAMPLE I

A body of single crystal silicon semiconductor material having a p-n junction contained therein was prepared in a suitable manner known to those skilled in the art. The p-n junction was exposed to the ambient in the side surfaces of the body. The body had a designed maximum allowable current leakage of 15 milliamps.

The body was disposed in a solution of 1% by volume of diphenyldichlorosilane in xylene. The body was heated in the solution for 15 minutes at a temperature of 10° C.±10° C. to form a reaction product of diphenyldichlorosilane, hydroxyl ions disposed in lattice sites on the surfaces of the body and silicon on at least the exposed surfaces of the p-n junction.

The body was removed from the solution and washed in acetone. The body was then placed in a vacuum chamber. A vacuum of $10^{-6}$ mm. of Hg was drawn on the body in the chamber as the temperature of the chamber was raised to 175° C.±10° C. in the chamber. The exhaust from the chamber was passed through a cold trap. The cold trap removed any moisture and any contaminants which had been drawn from the surfaces of the body. The body was treated in the vacuum chamber for 30 minutes.

The body was removed from the vacuum chamber and all exposed surfaces of the body were coated with a water impervious protective coating by hand. The water impervious coating was observed visually to cover all exposed surfaces of the p-n junction. The water impervious coating comprised a room temperature vulcanizing silicone rubber is a copolymer of dimethyl polysiloxane and methyl hydrogen polysiloxane with a curing catalyst lead octoate. The applied coating was allowed to cure for 24 hours.

The reverse blocking leakage current was measured and found to be 7.6 milliamperes. The forward blocking leakage current was 10 miamperes. After 17 hours the reverse blocking leakage current was 8.0 milliamperes and the forward blocking leakage current was 10.4 milliamperes.

Altogether 20 bodies of silicon semiconductor material were processed in the above-described manner. Six of these bodies were rated at 1020 volts and the balance were rated at 750 volts. These bodies were then subjected to a 20-hour blocking life test along with 15 bodies of silicon semiconductor material prepared from the same stock as the silane treated bodies. These 15 bodies had a protective coating comprising a mixture of alizarin in methyl-phenyl-silicone varnish only, disposed on the exposed surfaces of the p-n junction contained in each body. No monolayer of silane was formed initially on any exposed p-n junction surfaces.

Of the twenty bodies of silicon treated in accordance with the above example only one body exceeded the maximum allowed current leakage of 15 milliamps after the 20-hour blocking life test. This device leakage current changed only 2.0 milliamperes over the 20-hour blocking life test.

Of the fifteen bodies of silicon treated with the mixture of alizarin in methyl-phenyl-silicone varnish, all but four bodies exceeded the maximum allowable leakage of 15 milliamps. Six of the bodies had failed less than four hours after testing began.

This comparison clearly indicates that the forming of a layer of a reaction product of diphenyldichlorosilane and silicon and subsequently disposing a water impervious coating consisting of a room temperature vulcanizing silicone rubber does afford a good method for decreasing the effect of hydroxyl ions on exposed surfaces of p-n junctions in semiconductor bodies.

EXAMPLE II

A body of single crystal silicon semiconductor material having a p-n junction contained therein and having a portion of the p-n junction exposed in the side surfaces of the body was etched in a mixture of 2 parts by volume of 70–71% nitric acid, 1 part by volume of 48% hydrofluoric acid and 1 part by volume of 100% acetic acid. The body was then washed in acetone and dried.

The body was then placed in a dry box and the forward and reverse voltages determined at 15 milliamp leakage current. The forward voltage was 780 volts and the reverse voltage was 1040 volts. The voltage readings were obtained at a temperature of 129° C. This same temperature, 129° C., was standard temperature at which all later voltage readings were made during subsequent test checks.

The body was then heated in a vacuum of $10^{-6}$ mm. Hg to a temperature of 190° C. for 1 hour. At 15 milliamp leakage current the forward voltage had increased to 950 volts and the reverse voltage was now 1020 volts.

The body was then heated further in the same vacuum for 12 hours at the same temperature. A recheck of the forward and reverse voltages at the 15 milliamp leakage current showed them to be each 1020 volts.

The body was then placed in an ordinary muffle furnace utilizing no protective atmosphere. The body was heated to 190° C. and retained there for two hours. The forward and reverse voltages of the body was again checked at 15 milliamp leakage current and found to be 1000 volts and 1040 volts respectively.

The temperature of the muffle furnace was increased to 225° C. and the body heated at this temperature for 1 hour. At the 15 milliamp leakage test current both the forward voltage and the reverse voltage had dropped to 14 volts.

The body was then heated at 325° C. for 1 hour in the muffle furnace and the forward and reverse voltages rechecked at the same leakage current of 15 milliamps. The forward voltage was now 12 volts and the reverse voltage was 13 volts.

The body was then disposed in a solution of 1% by volume of diphenyldichlorosilane in xylene. The body was heated in the solution for 1 hour at 110° C.±10° C. to form a monolayer of a reaction product of diphenyldichlorosilane and hydroxyl ions disposed in lattice sites on the surfaces of the body and silicon over all exposed surfaces of the body and particularly those portions of the surface in which a part of the p-n junction terminated.

The body was removed from the solution and washed with acetone. The body was again tested at a 15 milliamp leakage test current for both the forward and the reverse voltages. The forward voltage was 950 volts. The reverse voltage was 1040 volts.

Thebody was then placed in a vacuum chamber. A vacuum of $10^{-6}$ mm. of Hg was maintained in the chamber. The temperature of the vacuum chamber was raised to 175° C.±10° C. The exhaust from the chamber was passed through a cold trap. The cold trap removed any moisture and any contaminants which had been withdrawn from the surface of the body. The body remained in the chamber for 30 minutes.

The body was removed from the vacuum chamber and all exposed surfaces of the body were coated with a water impervious protective coating by hand. The coating was observed visually to cover all exposed surfaces.

The protective coating was a room temperature vulcanizing silicone rubber. The room temperature vulcanizing silicon rubber was prepared by mixing a copolymer of dimethyl polysiloxane and methyl hydrogen polysiloxane with a catalyst lead octoate. The applied coating was allowed to cure for 24 hours.

The body was then heated in a muffle furnace in an unprotected atmosphere for 160 hours at 225° C. The forward and reverse voltages when checked at 129° C. and a reverse current of 15 milliamps had not changed from the previous readings.

The results show that a body of semiconductor material can be deliberately degradated and then upgraded to at least its original values or a higher value by treating it in a solution of 1% by volume of diphenyldichlorosilane in xylene. The water impervious protective coating which was added on top of the monolayer of the reaction product of diphenyldichlorosilane and silicon protected all exposed surfaces of the body from the deleterious effects of the surrounding ambient.

EXAMPLE III

A body of single crystal silicon semiconductor material having a p–n junction therein was prepared. A portion of the p–n junction was exposed in the side surfaces of the body. The body had a designed allowable leakage current of 15 milliamps. When tested at the 15 milliamp leakage current, at a temperature of 130° C., the forward voltage was 320 volts and the reverse voltage was 500 volts.

The body was disposed in a solution of 1% by volume of diphenyldichlorosilane in xylene. The body was heated in the solution for 15 minutes at a temperature of 110° C.±10° C. to form a monolayer of a reaction product of diphenyldichlorosilane and hydroxyl ions disposed in lattice sites on the surface of the body and silicon over all exposed surfaces of the body. Particularly, the monolayer was formed on those portions of the body surfaces in which the p–n junction was exposed.

The body was removed from the solution and washed in acetone. The body was then placed in a vacuum chamber. A vacuum of $10^{-6}$ mm. of Hg was drawn on the body in the chamber as the temperature of the chamber was raised to 175° C.±10° C. The exhaust from the chamber was passed through a cold trap. The cold trap removed any moisture and any contaminents which had been drawn from the surfaces of the body. The body was treated in the vacuum chamber for 30 minutes.

The body was removed from the vacuum chamber and all exposed surfaces of the body were coated with a water impervious protective coating material by hand. The coating was observed visually to cover all exposed surfaces.

The protective coating was a room temperature vulcanizing silicone rubber. The room temperature vulcanizing silicone rubber was prepared by mixing a copolymer of dimethyl polysiloxane and methyl hydrogen polysiloxane with a catalyst lead octoate. The applied coating was allowed to cure for 24 hours.

The coated body was then placed in a muffle furnace having an unprotected atmosphere. The body was heated at a temperature of 225° C. for 160 hours. The forward and reverse voltages were then checked at 120° C. and a leakage current of 15 milliamps. The forward voltage was 900 volts. The reverse voltage was 1000 volts.

The treating of the exposed surfaces of the p–n junction of the body in a solution of diphenyldichlorosilane in xylene and then coating the exposed surfaces with a water impervious material prevents the ambient, in which a treated body is exposed, from affecting the stabilized leakage current of the treated body.

EXAMPLE IV

The bodies of single crystal silicon semiconductor material, each having a p–n junction contained therein and each having a portion of the p–n junction exposed in the side surfaces of the body, were prepared from the same stock of single crystal silicon raw material. Each body was etched in a mixture of 2 parts by volume of 70–71% nitric acid, 1 part by volume of 48% hydrofluoric acid and 1 part by volume of 100% acetic acid. Each body was then washed in acetone and dried.

Each body was then disposed in a solution of 1% by volume of diphenyldichlorosilane in xylene. The bodies were heated in the solution for 1 hour at 110° C.±10° C. A reaction product of the diphenyldichlorosilane, the hydroxyl ions disposed in lattice sites on the surfaces of the silicon bodies and the silicon comprising the bodies was formed on all exposed surfaces of the bodies, particularly those portions of the surface in which a part of the p–n junctions terminated. The bodies were removed from the solution and washed with acetone.

Each body was then placed in a vacuum chamber. A vacuum of $10^{-6}$ mm. of Hg. was maintained in the chamber. The temperature of the vacuum chamber was raised to 175° C.±10° C. The exhaust from the chamber was passed through a cold trap. The cold trap removed any moisture and any contaminents which had been withdrawn from the surfaces of the bodies. The bodies remained in the chamber for 30 minutes.

One body was removed from the chamber and all exposed surfaces of the body were coated with a room temperature vulcanizing silicone rubber. The coating was observed visually to cover all exposed surfaces.

The room temperature vulcanizing silicone rubber was prepared by mixing a copolymer of dimethyl polysiloxane and methyl hydrogen polysiloxane with a catalyst lead octoate. The applied coating was allowed to cure for 24 hours.

The second body was removed from the chamber and all exposed surfaces of the body were coated with a methyl-phenyl-silicone varnish. The coating was observed visually to cover all exposed surfaces. Upon drying the coating was clear and had a vitreous characteristic.

The two treated bodies of silicon were then subjected to a 20 hour period of blocking life. Both bodies were designed for a 1000 volt class diode and a maximum allowed leakage of 15 milliamps.

Initially, the reverse blocking leakage current for the rubber coated body was 6.6 milliamps. Its forward blocking leakage current was 5.6 amps. At the end of the 20 hour period the reverse blocking leakage current was 6.4 milliamps and the reverse blocking leakage current was 6.0 milliamps. The rubber coating was observed physically to be in tact over the entire coated area of the body.

The initial reverse blocking leakage current for the varnish coated body was 14 milliamps. Its forward blocking leakage current was 6.0 milliamps. After less than 4 hours of the 20 hour test period had elapsed the body had exceeded the maximum allowed leakage current since its reverse blocking leakage current had reached 16 milliamps although its forward blocking leakage current was only 7.0 milliamps. Within another twelve hours, the varnish coated body had blown a fuse in the test unit rated at 250 milliamps.

Visual examination of the body revealed fracturing of the varnish coating. Further examination showed that the varnish coating had physically separated from surface of the body.

These results indicate that a rubber material is superior to a varnish material when used in conjunction with a halogenated organic silane treated body of semiconductor material to prevent the degradation of the performance of a body of semiconductor material.

While the invention has been described with reference to particular embodiments and examples, it will be understood of course, that modifications, substitutions and the like may be made therein without departing from its scope.

We claim as our invention:

1. A semiconductor device, said semiconductor device comprising a body of semiconductor material, said body of semiconductor material having at least one p-n junction contained therein and exposed at at least one surface of the body, a protective coating disposed on at least that portion of the surface of said body containing the exposed p-n junction, said protective coating consisting of a first layer of a reaction product of a halogenated organic silane, hydroxyl ions and the semiconductor material disposed on said portion and a second layer of a solid protective coating of a water impervious material selected from the group consisting of room temperature vulcanizing rubbers and perfluorohydrocarbons disposed on said first layer.

2. The semiconductor device of claim 1 in which the halogenated organic silane is diphenyldichlorosilane.

3. A semiconductor device, said semiconductor device comprising a body of silicon, said body having at least one p-n junction contained therein, and exposed at at least one surface of the body, a first layer of a reaction product of diphenyldichlorosilane, hydroxyl ions disposed in lattice sites on the surface of the body of silicon and silicon disposed on at least that portion of the surfaces of said body containing the exposed p-n junction and a second layer of a solid protective coating of a water impervious material selected from the groups consisting of room temperature vulcanizing rubbers and perfluorohydrocarbons disposed on said first layer.

4. A process for forming a protective coating on at least the exposed portion of a p-n junction contained within a surface of a body of semiconductor material comprising the steps of (1) disposing the body of semiconductor material in a solution of diphenyldichlorosilane in a nonreactive solvent, (2) heating the body in the solution at a temperature above approximately 100 °C. for a sufficient time to form a first layer of a reaction product of diphenyldichlorosilane, hydroxyl ions disposed in lattice sites on the surface of the body of semiconductor material and the semiconductor material comprising the body on at least the surface of the body containing the exposed potrion of the p-n junction, (3) removing excess water vapor from said first layer, and (4) disposing on said first layer a second layer of a water impervious solid material selected from the group consisting of room temperature vulcanizing rubbers and perfluorohydrocarbons.

5. A process for forming a protective coating on at least the exposed portion of a p-n junction contained within a surface of a body of semiconductor material comprising the steps of (1) disposing the body of semiconductor material in a solution of from ½% to 3% by volume of diphenyldichlorosilane in xylene, (2) heating the body in the solution at a temperature of from 90° C. to 130° C. for a sufficient time to form a first layer of a reaction product of diphenyldichlorosilane, hydroxyl ions disposed in lattice sites on the surface of the body of semiconductor material and the semiconductor material on at least the surface of the body containing the exposed portion of the p-n junciton, (3) removing excess water vapor from said first layer, and (4) disposing on said first layer a second layer of a water impervious solid material selected from the group consisting of room temperature vulcanizing rubbers and perfluorohydrocarbons.

6. A process for forming a protective coating on at least the exposed portion of a p-n junction contained within a surface of a body of single crystal silicon semiconductor material comprising the steps of (1) disposing the body in a solution of 1% by volume of diphenyldichlorosilane in xylene, (2) heating the body in the solution at a temperature of 110° C.±10° C. for a sufficient time to form a first layer of a reaction product of diphenyldichlorosilane, hydroxyl ions disposed in lattice sites on the surface of the body of silicon and silicon on at least the surface of the body containing the exposed portion of the p-n junction, (3) removing excess water vapor from the first layer, and (4) disposing on said first layer a second layer of a water impervious solid material selected from the group consisting of room temperature vulcanizing rubbers and perfluorohydrocarbons.

7. The process of claim 6 in which the body is heated in the solution for 1 hour and the water impervious material is a room temperature vulcanizing rubber.

8. A process for forming a protective coating on at least the exposed surfaces of a p-n junction on a body of semiconductor material comprising the steps of (1) heating the body in an atmosphere containing at least water vapor above approximately 190° C. for a sufficient time to chemically react available active semiconductor material surface sites of at least the exposed surfaces of said p-n junction with said water vapor to form hydroxyl groups, (2) disposing the body in a solution of diphenyldichlorosilane in a non-reactive solvent, (3) heating the body in the solution at a temperautre in excess of approximately 100° C. for a sufficient time to form a first layer of a reaction product of diphenyldichlorosilane, hydroxyl groups disposed in the active semiconductor material surface sites and the semiconductor material on at least said exposed surfaces of said p-n junction, (4) removing excess water vapor from said first layer and (5) disposing on said first layer a second layer of a water impervious solid material selected from the group consisting of room temperature vulcanizing rubbers and perfluorohydrocarbons.

9. A process for forming a protective coating on at least the exposed surfaces of a p-n junction in a body of semiconductor material comprising the steps of (1) heating the body in an atmosphere containing at least water vapor above approximately 190° for a sufficient time to chemically react available active semiconductor material surface sites of at least the exposed surfaces of said p-n junction with said water vapor to form hydroxyl groups, (2) disposing the body in a solution of from ½% to 3% by volume of diphenyldichlorosilane in xylene, (3) heating the body in the solution for a sufficient time at a temperature of from 90° C. to 130° C. to form a first layer of a reaction product of diphenyldichlorosilane, hydroxyl groups disposed in the active semiconductor material surface sites and the semiconductor material on at least said exposed surfaces of said p-n junction, (4) removing excess water vapor from said first layer, and (5) disposing on said first layer a second layer of a water impervious solid material selected from the group consisting of room temperature vulcanizing rubbers and perfluorohydrocarbons.

10. A process for forming a protective coating on at least the exposed surfaces of a p-n junction in a body of single crystal silicon semiconductor material comprising the steps of (1) heating the body in an atmosphere containing at least water vapor above approximately 190° C. for a sufficient time to chemically react available active silicon surface sites of at least the exposed surfaces of said p-n junction with said water vapor to form hydroxyl groups, (2) disposing the body in a solution of 1% by volume of diphenyldichlorosilane in xylene, (3) heating the body in the solution for a sufficient time at a temperature of 110° C.±10° C. to form a first layer of a reaction product of diphenyldichlorosilane, hydroxyl ions disposed in the active silicon surface sites and the silicon on at least said exposed surfaces of said p-n junction, (4) removing excess water vapor from said first layer, and (5) disposing on said first layer a second layer of a water impervious solid material selected from the group consisting of room temperature vulcanizing rubbers and perfluorohydrocarbons.

11. The process of claim 10 in which the body is heated in the solution for 1 hour and the water impervious material is a room temperature vulcanizing rubber.

References Cited

UNITED STATES PATENTS

| | | | |
|---|---|---|---|
| 2,306,222 | 12/1942 | Patnode | 117—106 |
| 3,012,006 | 12/1961 | Holbrook et al. | 117—121 X |
| 3,114,663 | 12/1963 | Klerer | 117—201 X |
| 3,242,007 | 3/1966 | Jensen | 117—201 |

WILLIAM D. MARTIN, *Primary Examiner.*

R. HUSACK, *Assistant Examiner.*

U.S. Cl. X.R.

117—119, 218